Figure 3A:
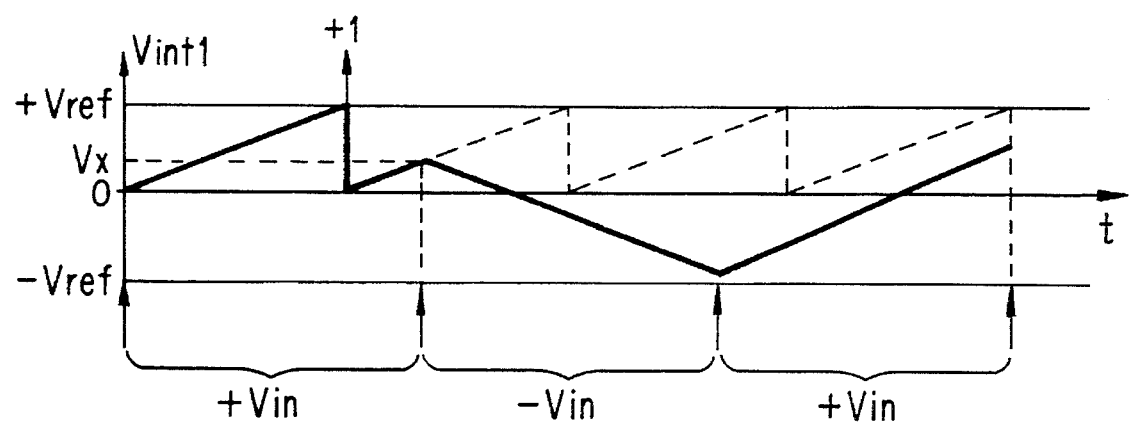

United States Patent
Bénéteau et al.

[19]

[11] Patent Number: 5,459,464

[45] Date of Patent: Oct. 17, 1995

[54] FREQUENCY MODULATED INTEGRATOR CIRCUIT

[75] Inventors: Lionel Bénéteau, Montrouge; Michel Gervais, Champigny Sur Marne, both of France

[73] Assignee: Schlumberger Industries, S.A., Montrouge, France

[21] Appl. No.: 182,877

[22] Filed: Jan. 13, 1994

[30] Foreign Application Priority Data

Jan. 20, 1993 [EP] European Pat. Off. .............. 93400130

[51] Int. Cl.⁶ .................................................. H03M 3/02
[52] U.S. Cl. ........................................................ 341/143
[58] Field of Search ........................... 341/143, 152, 341/144, 155, 166; 320/21; 333/172, 174

[56] References Cited

U.S. PATENT DOCUMENTS 4,653,017  3/1987  Colbeck et al. ..................... 364/825
5,206,648  4/1993  Yukawa ................................ 341/143

FOREIGN PATENT DOCUMENTS

0354060A3  2/1990  European Pat. Off. .
0461282A1  12/1991  European Pat. Off. .
2846598  4/1980  Germany .

*Primary Examiner*—Brian K. Young
*Attorney, Agent, or Firm*—Sanford J. Asman

[57] ABSTRACT

A modulated integrator circuit frequency modulates an input signal and has an integrator comprised of an amplifier (31) and an intregrating capacitor (35) connected across an input and an output of the amplifier. The circuit further comprises a storage capacitor (36) in addition to any switching capacitors (C) associated with the modulation of the input signal if present. The storage means (36) is connectable between the input and the output of the amplifier in parallel with the integrating capacitor. The storage capacitor stores a charge associated with the voltage of the output of the amplifier and transfer such charge to the integrating capacitor to enable reversal of the charge of the integrating capacitor in synchronism with the frequency modulation of the input signal.

15 Claims, 4 Drawing Sheets

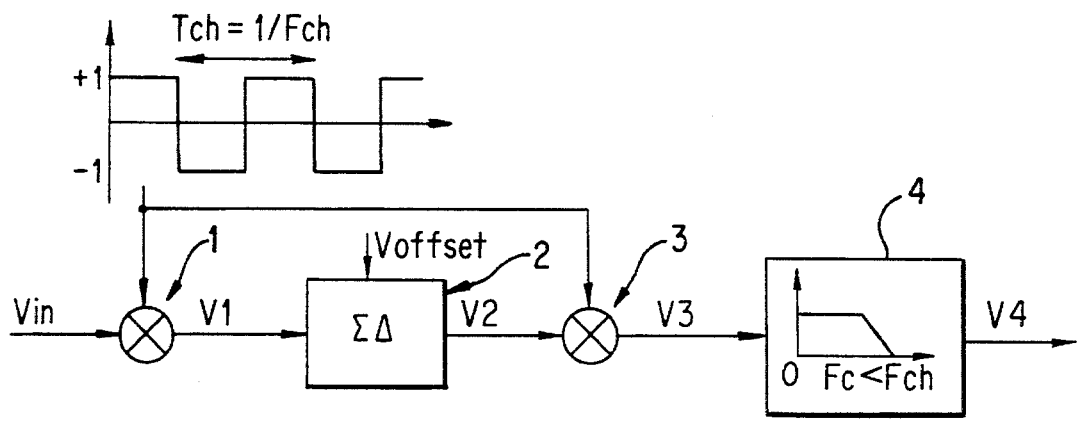
F I G. 1
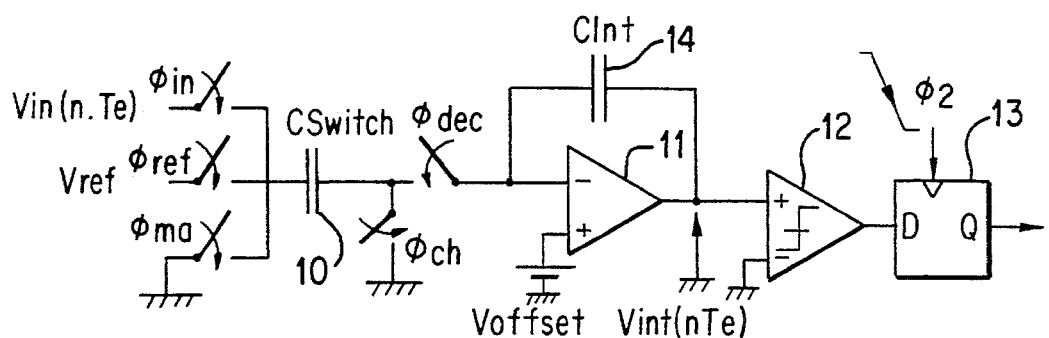
F I G. 2

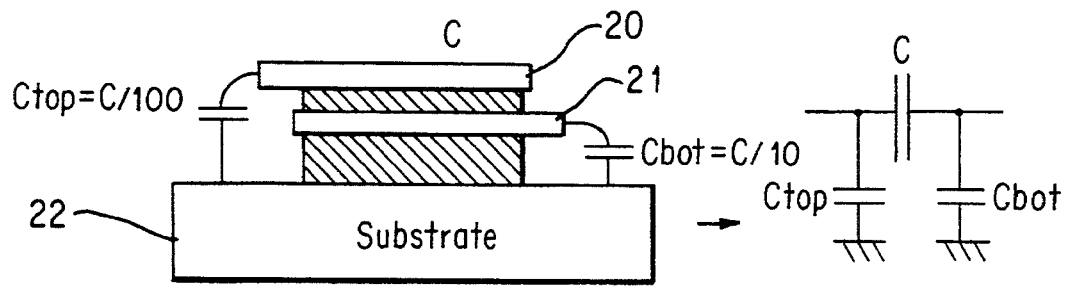
F I G. 4
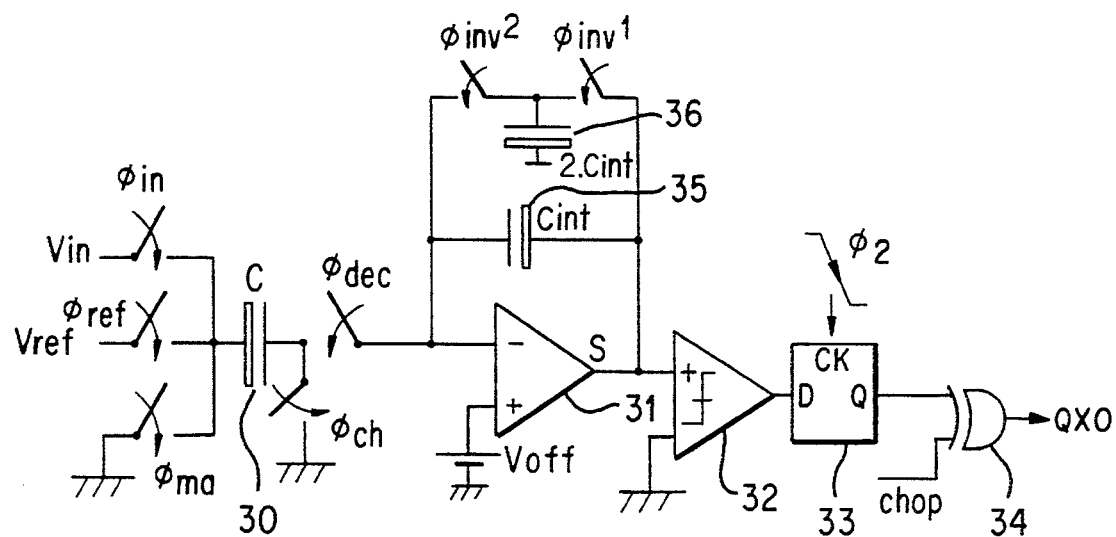
F I G. 5

FREQUENCY MODULATED INTEGRATOR CIRCUIT

The present invention relates to a modulated integrator circuit, including a means for frequency modulating an input signal and an integrator means comprising an amplifier and an integrating capacitor switchingly connected across an input and an output of the amplifier.

Integrator circuits can suffer from problems associated with voltage offsets across the input of the amplifier. Frequency modulation or "chopping" of the input signal is one well-known method of removing the effect of these offset voltages. Typically, the polarity of an input signal to the amplifier is modulated by an applied frequency or "chopper" signal in the form of a square wave, such that the input signal is applied alternately with a positive and negative polarity. The modulated signal, and any offset voltage, is integrated and the output signal is then demodulated, for example, by an exclusive OR gate clocked by the frequency signal. This demodulated signal comprises a constant signal corresponding to the integrated input signal superimposed with an offset noise signal having the frequency of the chopper signal. The offset signal can then be removed by filtering the composite signal through a filter having a high frequency cut-off below the chopper frequency.

Such modulating techniques are used in particular in Sigma-Delta analogue to digital converters, in which a reference voltage of varying sign is summed with an input voltage and integrated. The output of the integrator is sent to a comparator and the output of the comparator is fed back to control the polarity of the reference voltage. The polarity of the reference voltage is chosen to tend to bring the output of the integrator towards zero. Such converters are well-known in the art and are described, for example, in U.S. Pat. Nos. 3,659,288, 4,009,475 and many others.

Their operation is conventional and need not be discussed in any further detail. Frequency modulation, in which the polarity of the input voltage is additionally varied, is also known in relation to these circuits and is discussed in FR 2 570 854, in which an input voltage is sampled by means of an arrangement of switching capacitors, the polarity of the input voltage being variable according to the sequence of capacitor switching used.

Frequency modulation of an integrator circuit including an amplifier and a capacitor gives use to a particular problem associated with the integrating capacitor. As a signal is being integrated, the charge on the integrating capacitor rises. If the polarity of the input signal is then reversed, i.e. by the frequency modulated signal, the integrating capacitor will then be charged in the opposite sense to that of the new input signal and the new output of the amplifier. This introduces an error in the integration. In order to overcome this problem of the "memory" of the integrating capacitor, the polarity of the charge in the integrating capacitor should also be reversed at the time of the reversal of the input signal, i.e. so that the integration can continue from the same point, but with the charge on the integrating capacitor being reversed to reflect the change in the polarity of the input.

Conventionally, this reversal of the polarity of the integrating capacitor is accomplished by means of a simple switching connection around the integrating capacitor, the connections to each plate of the integrating capacitor being reversed at the same time as the change in polarity of the input signal. However, this conventional system suffers from two major disadvantages. Firstly, disconnecting the integrating capacitor from the connection between the input and output of the amplifier has the result that, until the capacitor is reconnected the amplifier is in an open loop condition, i.e. there is no feedback path between the input and the output. In this condition, the risk of saturation of the amplifier becomes great.

The second disadvantage associated with simple reversal of the capacitor relates to irregularities associated with the charges stored on each plate of the capacitor. This problem is particularly acute where the components of the integrating circuit are constructed using CMOS technology where the integrating capacitor will comprise an upper and a lower plate arranged above a common substrate. In addition to the capacitance between the two plates, capacitances will also exist between each of the plates and the substrate. The value of these parasitic capacitances will depend on the distance of the plate from the substrate, such that the parasitic capacitance for the lower plate will be considerably greater than that of the upper plate. Typically, for most specifications, the lower plate parasitic capacitance will be on the order of 10% of the value of the capacitor as a whole (i.e. the plate to plate capacitance) whilst the upper plate parasitic capacitance will be on the order of 1% of the capacitance of the plate to plate capacitor.

This asymmetry between the upper and lower plates of the capacitor can give rise to quite considerable errors as the integrating capacitor is switched between positions, as charge accumulated by the lower plate parasitic capacitance, when connected to the output of the amplifier, will be injected into the plate to plate capacitance when the lower plate is switched to the high impedance amplifier input.

An alternative method of reversing the charge in the integrating capacitor is that described in the article "A 16 bit Low-Voltage CMOS A/D Converter" J. Robert et al, IEEE Journal of Solid-State Circuits, Vol. SC-22, N° 2, April 1987. The circuit described in this paper comprises an amplifier and integrator capacitor and, connected between the input of the amplifier and the input signals, a switching capacitor used to sample and transfer input signals to the amplifier. As with conventional switched capacitor circuits, the function of the switching capacitor is to control the polarity of signals to the amplifier, i.e. to reverse the polarity of an input, if required, and the gain of the amplifier, usually set at unity, is determined by the ratio of the capacitances of the integrating capacitor and the switching capacitor.

In the method discussed in this paper, the switching capacitor is also used to reverse the charge of the integrating capacitor at the time of reversal of the input signal during modulation. A three stage operation is used. Firstly, the output at the amplifier at that instant is connected to the switching capacitor. Secondly, the charge on the integrating capacitor is cleared and, thirdly, the charge on the switching capacitor is transferred to the integrating capacitor, such that the integrating capacitor is now charged to the reverse polarity.

Although this circuit overcomes the problems of placing the amplifier in an open loop it still has a number of disadvantages. In particular, the ratio of the capacitance of the integrating and switching capacitor determines both the gain of the amplifier and the charge transferred during the reversing operation. This means, firstly, that the ratio and hence the gain must be fixed at unity to give correct transfer of charge of the integrating capacitor. Furthermore, problems associated with parasitic capacitances will still arise and the dual function of the switching capacitor makes it difficult to compensate for these. Also, this system suffers from the disadvantage that a relatively large number of operations are required to reverse the charge on the capacitor, including the step of clearing the integrating capacitor before transfering the charge on the switching capacitor to the integrating capacitor.

The present invention is characterised in that the circuit further comprises a storage means, in addition to any switching capacitors associated with the modulation of the input signal if present. The storage means is being switchingly connected between the input and the output of the amplifier in parallel with the integrating capacitor and is operable to store charge associated with the voltage of the output of the amplifier and to transfer such charge to the integrating capacitor to enable reversal of the charge of the integrating capacitor in synchronism with the frequency modulation of the input signal.

Use of an additional storage means in parallel to the integrating capacitor overcomes the problems of the conventional systems associated with leaving the amplifier in an open-loop condition. Furthermore, use of a functionally dedicated storage means, in addition to any switching capacitors (if present), enables the capacitance of the storage means to be chosen specifically to give the best matching with the integrating capacitor and, where a switching capacitor is also used, to enable the gain of the amplifier to be set as desired, e.g. to values greater than one.

In a particularly preferred embodiment the storage means has substantially twice the capacitance of the integrating capacitor, the circuit being operable to charge the storage means simultaneously with the plate of the integrating capacitor connected to the output of the amplifier and then to deposit this charge, corresponding to substantially twice the charge of the integrating capacitor, at the other plate of the integrating capacitor to effectively reverse the sign of the capacitor.

Addition of a charge of twice the charge of the integrating capacitor, but of the opposite sign, results in the capacitor assuming the opposite sign. This provides a particularly simple and elegant way of inverting the integrating capacitor, such that the voltage at the output plate of the integrating capacitor immediately matches that of the output of the amplifier after inversion of the input signal. In particular, the problems associated with the large number of steps to effect capacitor inversion in the Roberts circuit are overcome as there is no requirement to provide a reset step to clear the charge on the integrating capacitor.

Preferably, the integrating capacitor is connected across the amplifier such that the plate of the capacitor having the largest parasitic capacitance is connected to the output of the amplifier. For example, the integrating capacitor may comprise a CMOS capacitor in which the bottom plate is connected to the amplifier output and the top plate to the amplifier input.

In an amplifier approaching ideal conditions the output of the amplifier may be represented by a low resistance current source and the input by a load of infinite resistance. Most amplifiers approach these specifications, particularly operational amplifiers. Arranging the integrating capacitor as described minimises the effects of the parasitic capacitances, as the larger parasitic capacitance is always connected to the current source. Hence any residual charges remaining after inversion of the capacitor will be quickly neutralised by the current source. By using an additional storage means to invert the capacitor, rather than by swopping the capacitor connections, as in the conventional systems, the larger parasitic capacitance of the integrator may be permanently connected to the output, avoiding the injection of unwanted charge that occurs when the parasitic capacitance is suddenly placed at the high impedance input with the conventional systems. The effects of the lower parasitic capacitance, connected permanently to the input of the amplifier, are usually minimal. This connection arrangement of the integrating capacitor is not suggested in any of the prior art systems, including that of Roberts discussed above.

Preferably, the storage means comprises a capacitor, in which the plate of the storage capacitor having the smallest parasitic capacitance is alternately connectable to the input and output plates of the integrating capacitor, the other plate of the storage capacitor being connected to a ground or equivalent.

Connection of the lowest parasitic capacitance plate to ground in this way removes the effects of the large errors associated with the storage capacitor, as this capacitance is not relied upon in the transfer of charge. This means that the plate to plate value of the capacitance of the storage capacitor given will closely correspond to the desired value of twice the capacitance of the integrating capacitor. As an alternative to, or in addition to this, the specification of the storage capacitor can be chosen such that the main capacitance of the plates of the storage capacitor together with the parasitic capacitance of the plate of the storage capacitor connectable to the input and output plates of the integrating capacitor present a global capacitance of twice the value of the integrating capacitor. In this embodiment, only one plate of the storage capacitor ever transfers charge, such that no assymmetries ever arise. Use of a dedicated storage capacitor, as opposed to use of a switching capacitor for this purpose, means that the specification of the storage capacitor can be chosen for the optimum effect.

In one embodiment, frequency modulation may be effected by a switching capacitor arrangement to invert the input signal.

The invention extends to a sigma-delta analogue to digital converter including such an integrator circuit and, in particular, a sigma-delta multiplier circuit comprising two sigma-delta circuits, such as that shown in FR 2 570 854, in which one or both sigma-delta converters include such an integrator. The invention also extends to an electricity metering including such a multiplier circuit.

Figure 3B:
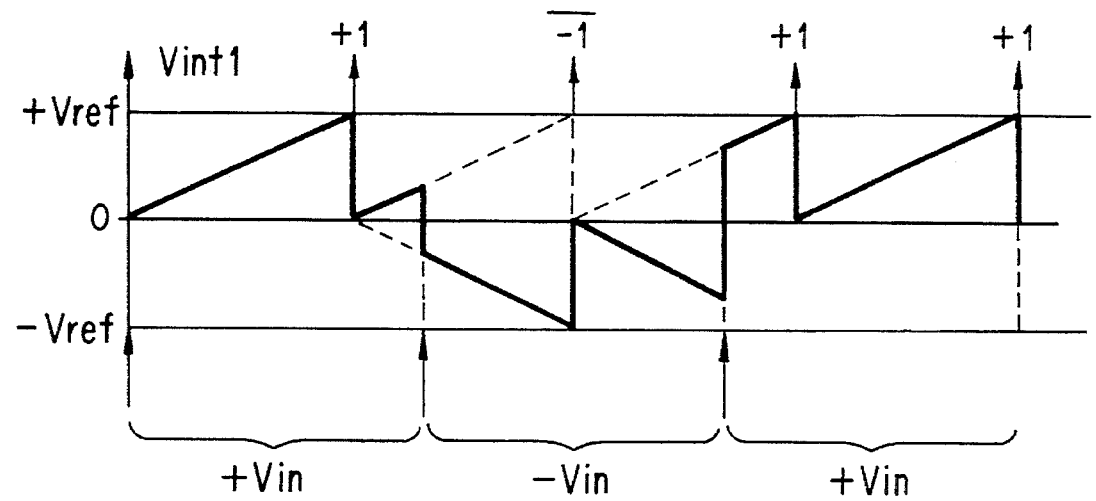
Figure 6:
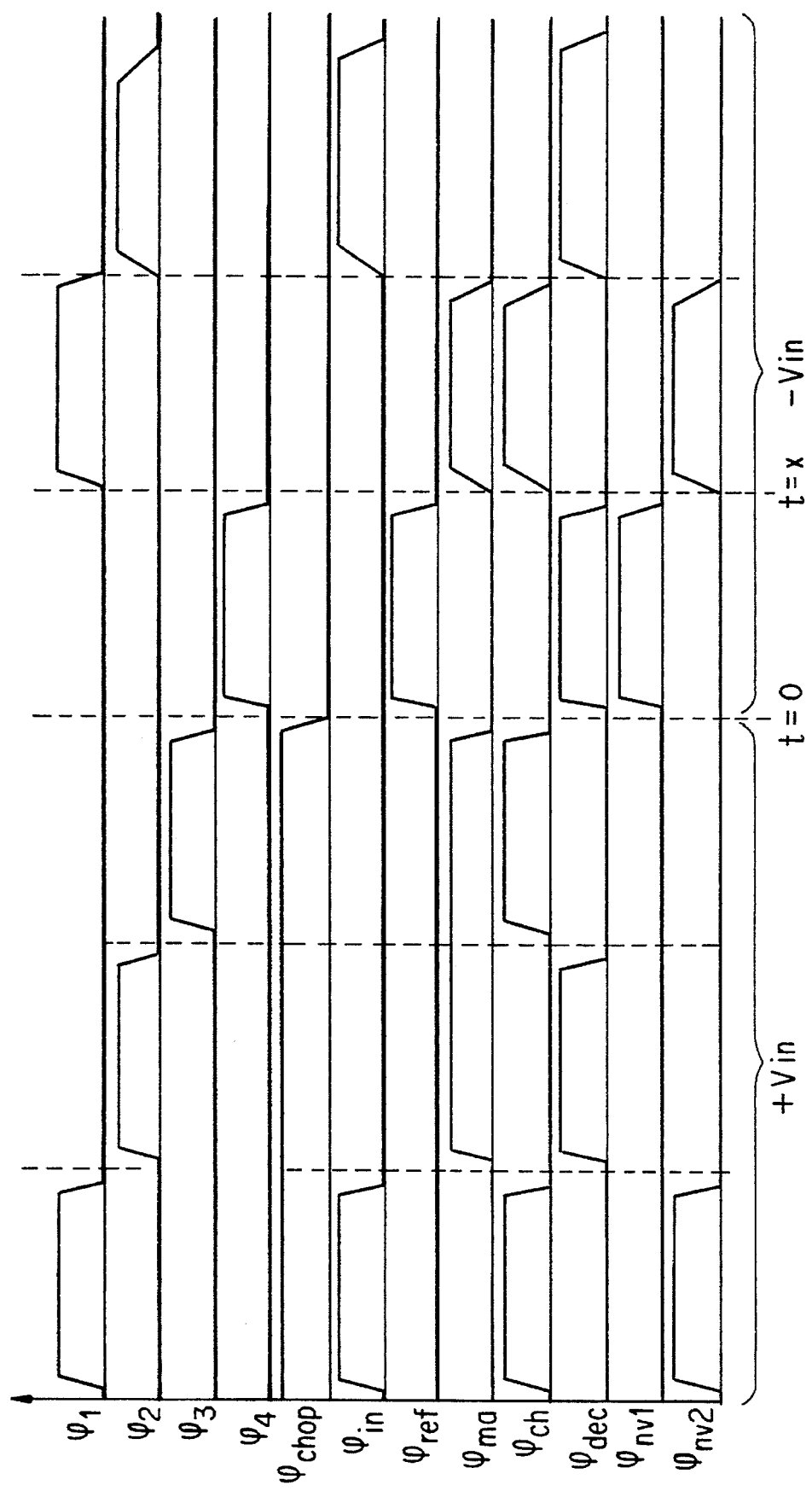

There will now be described, by way of example, a preferred embodiment of the present invention, with reference to the accompanying drawings, in which:

FIG. 1 shows a generalised circuit using frequency modulation of an input signal to overcome offset errors, FIG. 2 shows a conventional sigma-delta converter adapted to enable frequency modulation of input signals, FIG. 3 represents the charge on the integrating capacitor without and with inversion of the integrating capacitor, FIG. 4 is a representation of a capacitor constructed with CMOS technology, FIG. 5 shows a sigma-delta converter according to an embodiment of the invention, and FIG. 6 shows a timing diagram of the switching arrangement associated with the sigma-delta converter of FIG. 4.

Referring to FIG. 1, there is shown a generalised view of a circuit, such as a sigma-delta circuit, including frequency modulation. A chopper signal Tch is added to the input signal Vin1 at point 1 and the combined signal is passed through the sigma-delta converter 2, which includes an associated constant offset voltage Voffset. The output signal is demodulated at 3 by subtraction of the same chopper signal. The demodulated signal at this point will comprise the converted input signal having a constant value and a superimposed offset noise signal having the frequency of the chopper signal. This signal is then passed through a filter 4 having a frequency cut-off $F_c$ at a point below the frequency of the chopper signal, thereby filtering out the offset noise and providing a signal corresponding to the converted input signal without the effects of the offset. This technique is well-known and need not be described in any further detail.

Referring to FIG. 2, there is shown a conventional sigma-delta conversion circuit including switching capacitor means for controlling the polarity of the input reference voltage and for changing the polarity voltage to effect frequency modulation. Specifically, input signal Vin and reference signal Vref are fed via an arrangement of switches φin, φref, φma, φch, φdec and a switching capacitor 10 to an operational amplifier 11 and integrating capacitor 14. The polarity of the signal sent to the amplifier is dependent on the order in which the switches are operated. For example, in order to transmit Vref with the same polarity to the input of the amplifier 11, φref and φch are first closed to place a charge corresponding to Vref on the switching capacitor 10. Then φref and φch are opened and φdec and φma closed such that φma is connected to earth and the charge appears at the input of the amplifier 11 with the same polarity as the input voltage. To transmit Vref with an opposite polarity, φref and φdec are closed simultaneously, such that a charge of the opposite potential appears at the other side of the capacitor and to the input of the amplifier.

This reversal of signals through use of a switching capacitor and associated switches is well-known in the art. Similarly, the operation of the sigma-delta circuit shown in FIG. 2 to control the polarity of the reference voltage Vref using the switching arrangement and depending on the clocked output Q of the comparator 12 and bistable 13 is quite conventional. Modulation of the input signal Vin is controlled by varying the polarity of the input signal through the timing of the switches in a similar manner. Demodulation of the signal is achieved by means of an EOR gate (not shown).

FIG. 3 shows the effects of changing the polarity of the input signal Vin in the cases where firstly, the integrating capacitor 14 is not reversed and, secondly, where the integrating capacitor is reversed. Referring to the uppermost figure, at the first instant of reversal, where +Vin changes to −Vin, the voltage Vint at the output of the amplifier 11 is at a non-zero point Vx. Reversing the polarity of the input signal Vin at this point in the cycle without reversing the capacitor means that, subsequently, the output of the integrator has to firstly clear off the residual charge on the integrating capacitor and then to bring the change to the capacitor to the same magnitude as at the time of the inversion but with a reverse polarity before the input signal may be integrated to the point where it rises above the reference value to the comparator 12 to control Vref of the opposite polarity to be injected. As shown in the upper figure, if the input voltage Vin is again reversed to return to a positive voltage, this point may not be reached in the available time. In contrast, where the capacitor 14 is reversed at the point of inversion of the input voltage, the integrator will commence its integration with the correct initial conditions, such that an output Q correctly reflecting the magnitude of the input voltage will result.

As discussed previously, simple reversal of the capacitor to overcome this problem gives rise to two further problems. Firstly, the amplifier is placed in an open-loop condition for some time as the capacitor is disconnected, increasing the risk of saturation of the amplifier. Secondly, reversal of the capacitor causes problems associated with the parasitic capacitances associated with the capacitor. Referring to FIG. 4, a CMOS constructed capacitor 13 is shown, comprising a top plate 20 and a bottom plate 21 maintained in relation to each other and to a substrate 22. In addition to the capacitance between the plates 20, 21 capacitances also exist between each plate and the substrate, having the effect that the capacitor can be modelled as a single capacitor C together with two parasitic capacitances Cbot and Ctop. Due to the proximity of the lower plate 21 to the substrate 22, the bottom capacitance Cbot is considerably more significant, i.e. on the order of 10% of C, compared with 1% for Crop.

Referring to FIG. 2, if we imagine the integrating capacitor 14 to be arranged with its bottom plate connected to the output of the amplifier then, as the capacitor is reversed, the bottom parasitic capacitance will become connected to the input of the operational amplifier 11. As discussed earlier, the amplifier may be modelled as presenting an effectively infinite resistance at its inputs and a current source at its output. Accordingly, connecting Cbot to the high resistance input causes the parasitic capacitor to inject its charge into the main capacitance, causing errors in the integration. Reversing the capacitor in the opposite sense (i.e. from when Ctop is connected to the output) does not cause so many problems as the top capacitance Ctop injects only a small charge when connected to the input of the amplifier, and as any charge accumulated by Cbot when at the input will be cancelled by the operation of the current source at the output of the amplifier.

FIG. 5. shows an embodiment of the present invention which overcomes these problems. The sigma-delta circuit shown comprises a switching capacitor 30 together with associated switches φin, φref, φma, φch, φdec, operating as described before, an amplifier 31 and a comparator 32 and a clocked bistable 33. The circuit further comprises an exclusive OR gate (EOR) 34 which includes one input connected to the timing signal φchop to demodulate the output. The circuit also includes an integrating capacitor 35 together with a storage capacitor 36 arranged as shown in parallel, having twice the capacitance of the integrating capacitor 35 and having associated switches φinv1 and φinv2. Referring to the timing diagram shown in FIG. 6, a regular series of phase pulses φ1, 2, 3, 4 are generated e.g. by a microprocessor (not shown). The switches φin, φma, φref, φch, φdec are controlled by the microprocessor relative to these phases as in conventional circuits.

Expressed logically, the switches are controlled as follows:

φin=φ1.φchop+φ2.$\overline{\phi chop}$

φma=[φ1.$\overline{\phi chop}$+φ2.φchop]+[φ3.Q+φ4.$\bar{Q}$]

φref=φ3.$\bar{Q}$+φ4.Q

φch=φ1+φ3

φdec=φ2+φ4

As will be apparent, φin, φma are controlled depending on the signal modulation, determined by φchop, φma and φref further being controlled depending on the output Q, as in the conventional operation of a sigma-delta circuit.

Referring to the last two lines of FIG. 6, φinv1 and φinv2 are also controlled to transfer charge to reverse the polarity of the integrating capacitor 35. φchop and the modulation of the input signal changes over at the point t=0. The switch φinv1 is closed during the immediately subsequent timing sub-cycle φ4, to charge the storage capacitor 36 to the voltage Vint at the output of the amplifier, i.e. to charge the capacitor 36 to the value 2C.Vint. In the subsequent subcycle φ1, the switch φinv1 is disconnected and the switch φinv2 connected to deposit the charge 2C.Vint into the integrating capacitor 35. Immediately before this operation the capacitor 35 held the charge +C.Vint. After the charge from capacitor 36 is deposited the integrating capacitor holds the charge −2C.Vint+C.Vint=−C.Vint, i.e. the integrating capacitor has been effectively "reversed" such that the voltage of the capacitor at the output of the integrator has changed from +Vint to −Vint to reflect the change in the modulated input voltage.

As discussed previously, use of the storage capacitor 36 enables the charge to be reversed on the integrating capacitor 35 quickly and simply without putting the amplifier in an open loop condition, and avoiding problems associated with the parasitic capacitances. Referring to FIG. 5, the integrating capacitor 35 can be arranged with its bottom plate permanently connected to the output of the amplifier 31 in order to minimise the effects of the parasitic capacitance, the larger bottom plate capacitance being exposed only to the operation of the current source of the amplifier. Similarly, the top plate of the capacitor 36 may be connected to the integrating capacitor, the bottom plate being permanently connected to ground, such that the most significant capacitance value is the capacitance across the main plates. In addition, or alternatively to this, as one plate of the capacitor 36 is only ever used in transferring charge, the parasitic capacitance associated with this plate may be taken into account with the main capacitance in matching the total value of the capacitor 36 to the capacitor 35.

The present invention is equally applicable to other modulated integrating circuits in which the input to the integrator is periodically reversed. Similarly, the invention may be applied to one or both sigma-delta circuits used in a sigma-delta multiplication circuit, e.g. as found in the field of electricity metering. In such multiplication circuits, the output of a first sigma-delta converter controls the sign of is the input of a second sigma-delta converter, such that the output of the second sigma-delta circuit is representative of the product of the input signals to each converter. Such multiplication circuits are described in FR 2 570 854. In the field of electricity metering, the input of the first and second converters may be the current and voltage, respectively, such that the output of the second converter represents the energy taken by a load. The present invention may be incorporated in one or both sigma-delta converters.

We claim:

1. A modulated integrator circuit comprising:
   means for frequency modulating an input signal;
   integrator means comprising an amplifier and an integrating capacitor switchingly connected across an input and an output of the amplifier;
   storage means switchingly connected between the input and the output of the amplifier and in parallel with the integrating capacitor, said storage means being operable to store charge associated with a voltage of the output of the amplifier and to transfer said charge to the integrating capacitor to reverse the charge of the integrating capacitor in synchronism with the frequency modulation of the input signal.

2. A modulated integrator circuit as claimed in claim 1 in which the storage means has a capacitance twice as large as a capacitance for the integrating capacitor, the storage capacitor being charged simultaneously with a first terminal of the integrating capacitor and depositing the charge at the other terminal of the integrating capacitor to effectively reverse the polarity of the charge on the integrating capacitor.

3. A modulated integrator circuit as claimed in claim 1 in which the plate of the integrating capacitor having the largest parasitic capacitance is connected to the output of the amplifier.

4. A modulated integrator circuit as claimed in claim 1 in which the storage means comprises a storage capacitor, and in which a first plate of the storage capacitor having the smallest parasitic capacitance is alternately connectable to input and output plates of the integrating capacitor, the other plate of the storage capacitor being connected to ground.

5. A modulated integrator circuit as claimed in claim 1 in which the storage means comprises a storage capacitor having a capacitance equal to twice a capacitance of said integrating capacitor minus a parasitic capacitance of the storage capacitor.

6. A modulated integrator circuit as claimed in claim 5 in which the means for modulating the input signal comprises a switching capacitor arrangement to modulate the input signal.

7. A sigma-delta analogue to digital converter including a modulated integrator circuit as claimed in claim 6.

8. A multiplier circuit comprising two sigma-delta converters, in which one or both include a modulated integrator circuit as claimed in claim 1.

9. An electricity metering device using a multiplier circuit as claimed in claim 8 to calculate a product of the voltage and a current.

10. A circuit for integrating an input signal that has been modulated with a second signal, comprising:
    an amplifier having an input and an output, said input for receiving the modulated input signal;
    an integrating capacitor having a first terminal connected to the input of the amplifier and a second terminal connected to the output of the amplifier; and
    storage means connected in parallel to said integrating capacitor across the input and output of the amplifier, said storage means inverting a charge on said integrating capacitor in synchronism with said second signal;
    wherein a signal at the output of the amplifier equals an integrated modulated input signal.

11. The integrating circuit as set forth in claim 10, wherein said storage means is capable of storing twice as much charge as said integrating capacitor.

12. The integrating circuit as set forth in claim 10, wherein said storage means comprises:
    a storage capacitor having one terminal connected to ground;
    a first switch for connecting a second terminal of said storage capacitor to the output of the amplifier during a first time period; and
    a second switch for connecting the second terminal of said storage capacitor to input of the amplifier and to the first terminal of the integrating capacitor during a second time period.

13. The integrating circuit as set forth in claim 10, wherein said integrating capacitor comprises a CMOS capacitor having a top conductive plate connected to the output of said amplifier.

14. The integrating circuit as set forth in claim 10, wherein said storage means comprises a CMOS capacitor having a bottom conductive plate connected to ground.

15. The integrating circuit as set forth in claim 10, wherein said storage means has a storage capacitor and switching means, said switching means connecting said storage capacitor to said integrating capacitor so as to reduce said charge in said integrating capacitor by an amount sufficient to invert said charge in said integrating capacitor.

\* \* \* \* \*